(12) United States Patent
Ballou

(10) Patent No.: US 6,262,670 B1
(45) Date of Patent: Jul. 17, 2001

(54) SOURCE MEASURE UNIT HAVING SECONDARY FEEDBACK FOR ELIMINATING TRANSIENTS DURING RANGE CHANGING

(76) Inventor: Kevin R. Ballou, 1204 Long Ridge Dr., Seven Hills, OH (US) 44131

( * ) Notice: Subject to any disclaimer, the term of this patent is extended or adjusted under 35 U.S.C. 154(b) by 0 days.

(21) Appl. No.: 09/058,511

(22) Filed: Apr. 10, 1998

(51) Int. Cl.⁷ ................................................ G08B 21/00
(52) U.S. Cl. .................... 340/664; 340/463; 340/464; 340/635; 324/162; 324/207.17
(58) Field of Search ................................. 340/664, 661, 340/649, 635, 463, 464, 466; 324/510, 133, 120, 207.17, 162; 280/731; 364/138, 139; 327/94, 95, 96; 374/11; 240/691.6

(56) References Cited

U.S. PATENT DOCUMENTS

| | | | |
|---|---|---|---|
| 3,982,241 | * 9/1976 | Lipcon | 341/118 |
| 4,785,236 | * 11/1988 | Balogh et al. | 324/120 |
| 5,083,117 | * 1/1992 | Hoigaard | 340/649 |
| 5,098,196 | * 3/1992 | O'Neill | 374/11 |
| 5,337,230 | * 8/1994 | Baumgartner et al. | 364/138 |

* cited by examiner

Primary Examiner—Jeffery A. Hofsass
Assistant Examiner—Davetta W. Goins
(74) Attorney, Agent, or Firm—Pearne & Gordon LLP

(57) ABSTRACT

A source measure unit provides a constant voltage while measuring current and provides a constant current while measuring voltage. An output stage amplifier with a primary feedback loop provides the voltage and current. A secondary feedback loop includes a sample-and-hold circuit. Switches are provided to connect the secondary feedback loop to the amplifier input and disconnect the primary feedback loop from the amplifier input. While the primary feedback loop is disconnected, voltage or current ranges can be changed without affecting the amplifier output.

29 Claims, 3 Drawing Sheets

SOURCE MEASURE UNIT HAVING SECONDARY FEEDBACK FOR ELIMINATING TRANSIENTS DURING RANGE CHANGING

BACKGROUND OF THE INVENTION

The invention relates generally to the field of source measure units and specifically to a sample-and-hold feedback circuit for eliminating transients. A source measure unit (SMU) is an electronic instrument that is capable of providing a constant voltage ("sourcing") while measuring current and providing a constant current while measuring voltage. Features that are desirable in this type of instrument are high resolution and dynamic range in both sourcing and measuring, fast operation, and the absence of unexpected output transients. In order to simultaneously provide high resolution and large dynamic range, it is necessary to equip the instrument with multiple ranges for both voltage and current. The changing of these ranges during testing, however, can cause unwanted transients on the output of the instrument, especially when done quickly. This effect is particularly acute when the static output level is non-zero.

The most common consequence of these transient glitches is a temporary shift of the operating characteristics of the device-under-test. For example, the SMU applies a voltage to the gate-source junction of a MOSFET transistor while another instrument is measuring the drain-source resistance of the device. If the SMU produced an output transient during a range change operation, the energy of that transient would cause the highly capacitive gate-source junction to shift its voltage. This could substantially change the drain-source resistance value of the transistor even though the DC voltage level on the gate-source junction has not changed. Consequently, data taken immediately after the transient on the resistance versus voltage relationship would be in error. Moreover, if the SMU was configured to have a very low current compliance, that is, current drive capability, the time duration of the error could be substantial, as the gate-source capacitance would be discharged to its previous voltage level at a gradual rate. A less common, but more serious, consequence also appears in MOSFET testing. If the gate-source junction is being operated at a voltage that is close to its maximum rated limit, a transient spike could produce a voltage large enough to permanently damage the sensitive gate oxide material of the device.

FIG. 1 illustrates a simple amplifier system, which is analogous of prior art SMU design topology. Assuming that the setpoint signal from the D/A converter is 1V, and the values of R1 and R2 are equal, that is, R1/R2=1, this configuration will yield an output voltage of 2V. Now consider the situation where the ratio of R1/R2 changes to 9, but the desired output level is the same 2V. In order for this to be true, the setpoint signal must decrease to 0.2V. In fact, it must decrease at exactly the same rate and at exactly the same time that the resistor ratio increases in order for the output to show no movement. In practice, however, these operations are typically executed by a microprocessor in serial fashion. That is, one signal changes, followed by the other. Even if there is very little time between the operations, any perturbation in the difference between the signals will result in significant output movement due to the high gain of the amplifier. In theory it might be possible to design analog circuitry that equates the rate of change of the two elements. In practice, however, this would be very difficult to implement, especially over a large number of ranges.

To circumvent this issue, previous designs have implemented an algorithm in which the setpoint is set to zero prior to the switching of the feedback elements. Once the new feedback in is place, the setpoint is reprogrammed for the proper output. This scheme does succeed in lowering glitching, because the output is less sensitive to changes in the feedback elements when little or no voltage is across them. There are some applications, however, where the unexpected movement of the output to zero during testing is not acceptable. It would be preferable for the output to truly maintain its programmed level during the range change process.

BRIEF SUMMARY OF THE INVENTION

The invention provides a source measure unit including an output stage amplifier having an output and an input. A primary feedback loop is connected from the amplifier output to the amplifier input. A secondary feedback loop is connected from the amplifier output to the amplifier input. A sample-and-hold circuit is connected in the secondary feedback loop to sample and store a voltage representing an output of the amplifier. A first switch is connected between the primary feedback loop and the input, and a second switch is connected between the secondary feedback loop and the input.

According to one aspect of the invention, the source measure unit includes an output stage amplifier having an output and an input. A voltage programmer has a voltage setpoint output, and a voltage program inverter is connected to invert the voltage programmer output to provide an inverted voltage setpoint. A current programmer has a current setpoint output, and a current program inverter is connected to invert the current programmer output to provide an inverted current setpoint. A current range control resistance is connected to the output stage amplifier output and is variable for selecting a range of output currents. A primary current feedback loop from the output stage amplifier output to the output stage amplifier input includes a primary current differential amplifier connected across the current range control resistance, the output of the primary current differential amplifier being summed with the current setpoint to provide a positive current control signal and with the inverted current setpoint to provide a negative current control signal. A voltage range control resistor divider is connected to the output stage amplifier output and has variable attenuation for selecting a range of output voltages. A primary voltage feedback loop from the output stage amplifier output to the output stage amplifier input includes a primary voltage differential amplifier connected across the voltage range control resistor divider, the output of the primary voltage differential amplifier being summed with the voltage setpoint to provide a positive voltage control signal and with the inverted voltage setpoint to provide a negative voltage control signal. A switching control is connected to the output stage amplifier input and has a positive current input, a negative current input, a positive voltage input, and a negative voltage input, the switching control selectively connecting one of the switching control inputs to the output stage amplifier input. Primary input switches are provided for connecting the respective control signals to the respective switching control inputs such that the current control signal is connected to the positive current input, the inverted current control signal is connected to the negative current input, the voltage control signal is connected to the positive voltage input, and the inverted voltage control signal is connected to the negative voltage input.

A secondary current feedback loop from the output stage amplifier output includes a secondary current differential amplifier connected across a secondary current resistance at the amplifier output. A secondary voltage feedback loop from the output stage amplifier output includes a secondary voltage differential amplifier connected across a secondary voltage resistor divider at the amplifier output. A sample-and-hold circuit has an input connected to the outputs of the secondary differential amplifiers and has a secondary output and an inverted secondary output. A sampling input switch is provided for connecting the secondary current amplifier to the sample-and-hold circuit input. A voltage sampling input switch is provided for connecting the secondary voltage amplifier to the sample-and-hold circuit input. Secondary input switches are provided for connecting either of the secondary feedback loops to the respective switching control inputs such that the secondary output and sample-and-hold input are connected to the positive current input and the positive voltage input, and the inverted secondary current output and the sample-and-hold input are connected to the negative current input and the negative voltage input. The sampling input switches are connected so that at least one of the feedback loops is always connected to the switching control input during operation.

The sample-and-hold circuit includes a capacitor connected to store a sampled voltage from one of the secondary feedback differential amplifiers through the respective sampling input switch. The sample-and-hold circuit includes a reset switch for discharging the capacitor. The sample-and-hold circuit includes an absolute value amplifier connected to the capacitor to take the absolute value of the stored voltage, the output of the absolute value amplifier providing the secondary output. The sample-and-hold circuit includes an inverting amplifier connected to the output of the absolute value amplifier to provide the inverted secondary output. A voltage can be applied to adjust a voltage stored in the sample-and-hold circuit.

The invention includes the steps of providing a setpoint signal to an amplifier input; feeding an output of the amplifier back to the amplifier input; sampling and storing the output of the amplifier; connecting the stored output to the input; disconnecting the output from the input; adjusting the input to the amplifier; reconnecting the output to the input; and disconnecting the stored output from the input. The step of adjusting the input includes adjusting the feedback signal by changing the range after the output is disconnected from the input and before reconnecting the output to the input. The step of adjusting the input includes adjusting the setpoint signal after the output is disconnected from the input and before reconnecting the output to the input.

To maintain a constant output level during range changing, the secondary feedback loop controls the output while the primary feedback elements and setpoint are being changed. This secondary feedback loop includes three major components: a rangeless feedback element that is either in parallel or series with the primary element, a sample-and-hold circuit, and a mechanism for switching control between the primary and secondary control loops. During a range change, the output level is sampled through the secondary feedback element. This signal then creates a setpoint signal via the sample-and-hold circuit. Control of the main amplifier is then gradually switched from the normal feedback loop to the secondary feedback loop. Since the magnitude of the setpoint signal equals that of the feedback signal, the output level does not change. The primary feedback element and setpoint are then able to be changed in any way without affecting the output because they are no longer part of the amplifier's control loop. Once they have been changed, control of the main amplifier is gradually returned to the primary control loop, the secondary feedback circuitry is reset, and the range change process is complete.

The secondary feedback element for the voltage function is a resistor divider that is located in parallel with the primary feedback element, also a resistor divider. The attenuation ratio of this secondary divider never changes, thus making it "rangeless." It must therefore be capable of accepting applied voltages covering the entire operating range of the instrument. Unlike the primary divider, the secondary one does not need to be stable with respect to time and temperature. It is used only during the short duration of the range change, and the algorithm described above in a sense recalibrates it during each use. The secondary feedback element for the current function is a single resistor with diodes in parallel with it that is located in series with the primary feedback elements, multiple precision resistors. The diodes allow the network to pass a very high current without generating the large voltage drop that pure resistive feedback would create. The resistor, on the other hand, provides better control over low currents than the diodes alone would provide. Precision is similarly not critical in this element for the same reasons noted previously.

The secondary feedback signal is converted into a control loop setpoint signal via a combined sample-and-hold and absolute value circuit. The control loop architecture of the SMU requires that the setpoint signal be composed of two signals of equal magnitude but opposite polarity. Accordingly, this circuit is composed of a stage which captures and holds the secondary feedback signal on a capacitor, followed by a precision absolute value circuit and inverting amplifier. Given an input voltage signal of x volts, the outputs are $|x|$volts and $-|x|$volts. It is critical that the output magnitudes be extremely close to the magnitude of the input signal because any difference between them will result in instrument output movement when control is switched to the secondary feedback loop. The final component of this circuit block is a circuit that selectively increases the magnitude of the signal held on the capacitor. It is used only when the measure function range is being changed, not the source function. To explain why, it is necessary to describe in more depth the general operation of an SMU.

The output of an SMU is controlled by two parameters: the source value and the compliance value. If the source value is programmed to be a voltage, then the compliance, or limit value, is specified as a current. Conversely, if the source value is a current, the compliance is a voltage. As an example, assume that the SMU is programmed to a source value of 2V with a compliance of 1 mA. As long as the output current magnitude does not exceed 1 mA, the source feedback loop will be in control, and the output will be the desired 2V. If, however, the output current reached 1 mA, the current feedback loop would assume control and limit the current to that level. In this case the output voltage would be lower than the programmed value.

During a source range change, the secondary feedback loop replaces the normal source control loop. In order to have no perturbations in the value being sourced, it is necessary to make the created setpoint signal equal to the secondary feedback signal. During a measure range change, the secondary feedback loop replaces the normal compliance control loop. In this case the setpoint signal should be close to, but not equal to, the secondary feedback signal. If it is made equal, the instrument will indicate that the compliance value has been reached upon the switching of the control loops. This is incorrect operation. Consequently, the setpoint signal magnitude is made slightly larger than the sampled feedback signal. That is, the compliance during a measure range change is set slightly above the present output level. The benefit of the secondary feedback scheme in this case is that the compliance level remains below what could possibly damage a device-under-test. If, on the other hand, the primary feedback loop was changed without this invention, the effective compliance could far exceed the programmed value for a short time.

The last component of the secondary feedback system is the mechanism through which control is switched between the primary and secondary control loops. The critical issue with this operation is that it must be make-before-break. That is, a control path is not removed until the new one has been established in parallel.

DESCRIPTION OF THE INVENTION

Figure 2A:
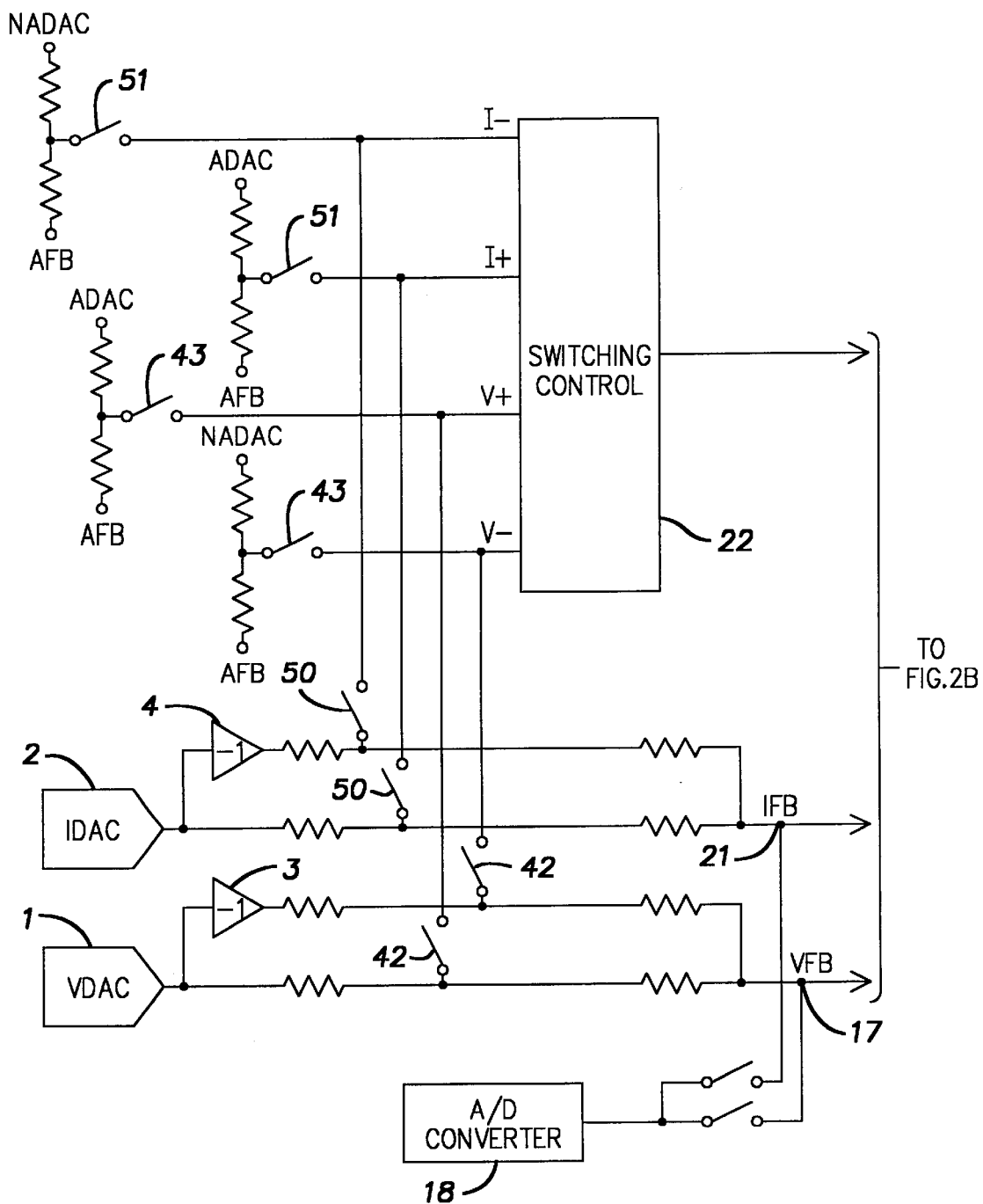
FIG. 2A is a schematic diagram of the invention.

Referring to FIG. 2A, a source measuring unit includes voltage and current programmers, such as digital-to-analog converters VDAC 1 and IDAC 2, used for setting desired output voltage and current levels, respectively. One programmer corresponds to a desired source value and the other to a desired compliance value. The specific assignment is programmed by the user. Each of the D/A outputs is passed through a respective voltage or current program inverting amplifier 3, 4. Setpoints are derived from the D/A converter 1, 2 outputs and inverter 3, 4 outputs. Each setpoint requires two signals of equal magnitude, but opposite polarity. In total, there are four setpoint signals created, two for voltage and two for current.

Figure 2B:
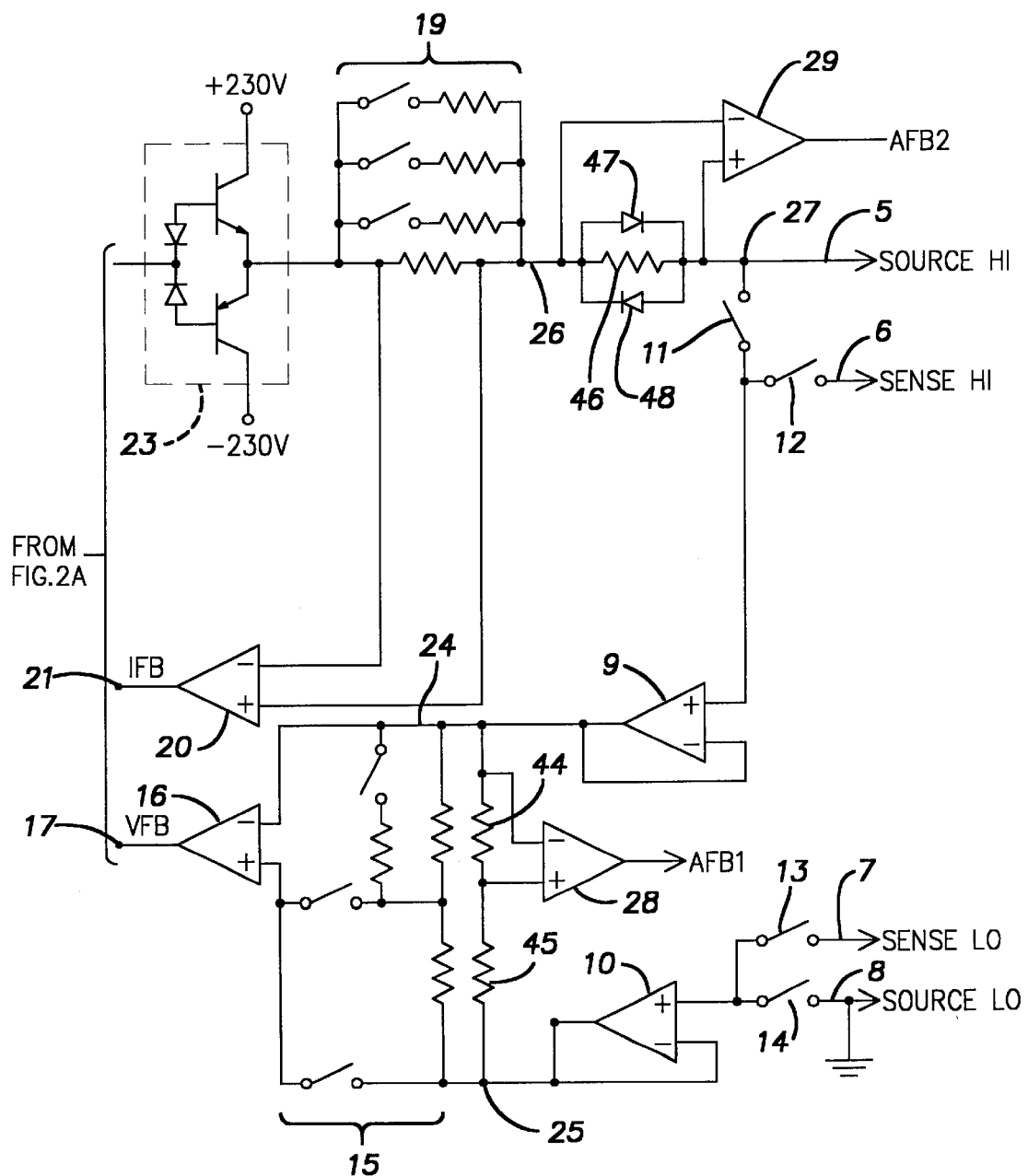
FIG. 2B is a schematic diagram of the invention.

As shown in FIG. 2B, output terminals of the unit include source high 5, sense high 6, sense low 7, and source low 8. Output current flows between terminals 5 and 8, and terminals 6 and 7 provide remote voltage sensing capability. Voltage sensing amplifiers 9 and 10 provide high impedance voltage sensing at each pair of inputs. Signal routing to these amplifiers is performed by corresponding switches 11, 12, 13, and 14. Voltage ranging is accomplished by the closure of switches within a voltage range resistance including a resistor attenuator 15. For example, attenuation ratios of 1:1, 10:1 and 100:1 are possible. Referring also to FIG. 2A, a primary voltage differential amplifier 16 translates the output of the attenuator 15 to a ground from which the voltage programming D/A converter (VDAC) 1 is referenced. This translation provides a primary voltage feedback signal VFB at the output 17 of the differential amplifier 16 representing the output voltage of the unit. The primary voltage feedback signal VFB is summed with the outputs of the voltage programming D/A converter 1 and inverting amplifier 3 to provide the positive voltage control signal V+ and negative voltage control signal V−, respectively. The VFB signal is also routed to an A/D converter 18 for voltage measurement.

Current sensing is attained by passing the output current through a stable shunt resistor and measuring the developed voltage. Current ranging is accomplished through the closure of switches within a current range control resistance, such as a resistor network 19 illustrated in FIG. 2B. Each switch combination yields a different impedance through which the output current will flow. Primary current differential amplifier 20 translates the voltage across the selected resistor to a ground from which the current programming D/A converter (IDAC) 2 is referenced. This translation provides a primary current feedback signal IFB at the output 21 of the differential amplifier 20 representing the output current of the unit. The primary current feedback signal IFB is summed with the outputs of D/A converter 2 and inverting amplifier 4, shown in FIG. 2A, to provide the positive current control signal I+ and negative current control signal I−, respectively. The IFB signal is also routed to the A/D converter 18 for current measurement.

Referring to FIG. 2A, the four control signals V+, V−, I+, I− are connected to a switching control block 22 through primary input switches 42 and 50. These four signals represent control signals for positive and negative voltage and positive and negative current. The switching control 22 routes the appropriate control signal to an output stage amplifier 23. The routing is controlled by the polarity and function of the source value and the state of compliance. As an example, assume that the SMU is programmed to a source value of 2V with a compliance of 1 mA. As long as the output current does not reach 1 mA, the signal labeled V+ will be in control. If the current reaches 1 mA, the routing will change so that I+ is in control. If the source value was negative, for example −2V, the only change to this example would be that the V− and I− signals would be used.

The output stage 23, illustrated in FIG. 2B, is a high voltage, high current bipolar amplifier that provides the output power for the instrument. Its output movement is determined by the signal level on the signal line routed to it. Specifically, when the voltage on the active control line is nonzero, the output level will change. Comparable to an operational amplifier, the output stage will respond in such a way as to force its control signal to zero.

For the purposes of defining the invention, it is sufficient to note that the output stage has considerable gain and will respond dramatically to any movement of its control signal away from zero. A benefit of the invention is to prevent movement of the appropriate control line during a range change, thus preventing undesirable output voltage transients.

A secondary feedback loop is used during voltage range changes and includes a resistor divider 44, 45 located between points 24 and 25. A secondary voltage differential amplifier 28 is connected across one of the resistors 44 and provides a secondary feedback signal AFB1 for voltage range changes. The divider does not have to be composed of precision elements because stability of the resistor ratio is required only for the duration of the range change process. The majority of the output voltage appears across the other resistor 45, which must be capable of handling the maximum instrument output. The output of the divider is passed through the differential amplifier 28, which translates the voltage to a ground from which the voltage D/A converter 1 is referenced.

A different secondary feedback loop is used during current range changes and includes a network having a resistor 46 and two antiparallel connected diodes 47, 48 between points 26 and 27. A secondary current differential amplifier 29 is connected across the network and provides a secondary feedback signal AFB2 for current range changes. These components do not need to be precision, but the diodes must be able to safely pass the maximum output current of the instrument. The voltage developed across the network is passed through the secondary current differential amplifier 29, which translates the voltage to a ground from which the current D/A converter 2 is referenced.

Figure 1:
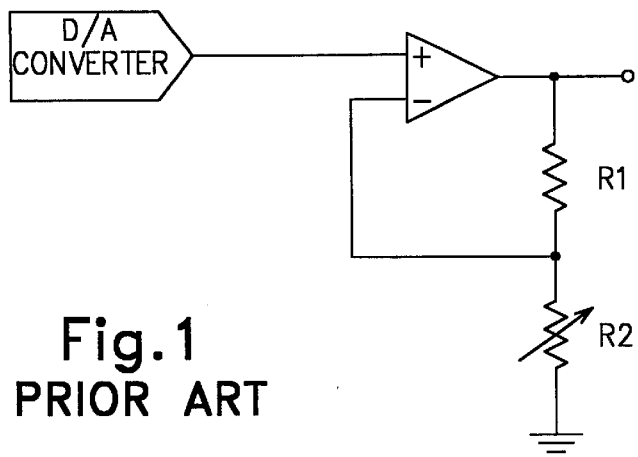
FIG. 1 is a simplified block diagram of a prior art source measure unit.
Figure 3:
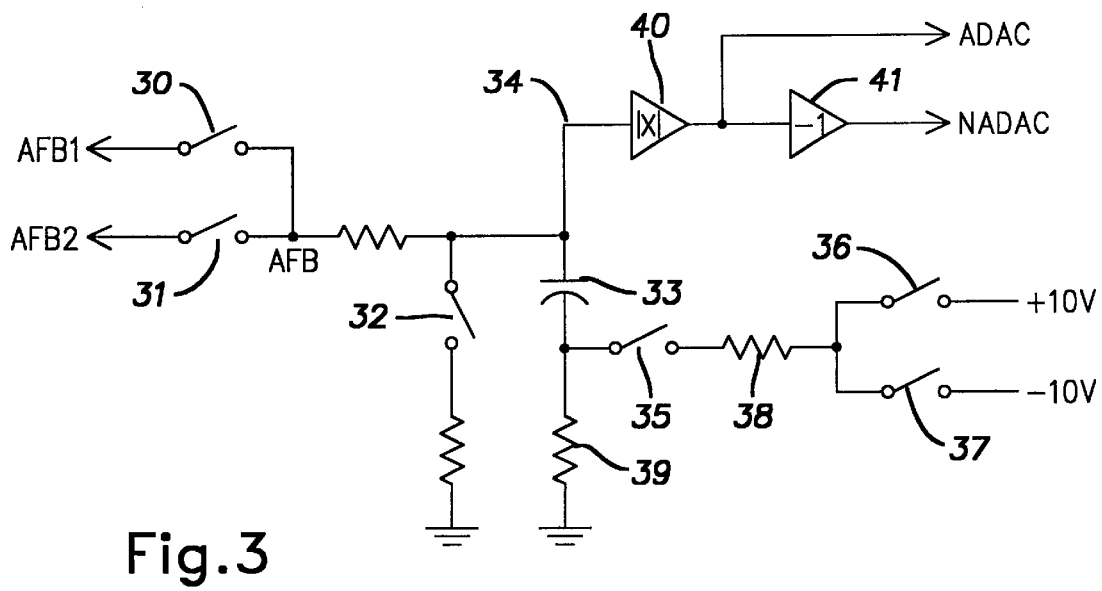
FIG. 3 is a schematic diagram of a secondary feed back sample-and-hold circuit according to the invention.

Referring to FIG. 3, the output signals AFB1, AFB2 from the differential amplifiers 28, 29 are passed to a sample-and-hold circuit. This circuit provides positive and negative secondary outputs ADAC, NADAC from the appropriate secondary feedback signals. The sample-and-hold circuit is connected to the secondary feedback signals AFB1, AFB2 through respective voltage and current sampling input switches 30, 31 that operate to select one of the secondary feedback signals as a sample-and-hold input AFB. The sample-and-hold circuit includes a capacitor 33 followed by a precision absolute value amplifier 40 and an inverting amplifier 41. When not in use, the circuit is held in reset by a reset switch 32 that discharges the capacitor 33. An adjustment switch 35 connects positive and negative adjustment voltages (for example +10V, −10V) to a voltage divider (resistors 38, 39) through connect switches 36, 37.

A range change process begins with the opening of reset switch 32. Then either sampling input switch 30 or 31 is closed, charging capacitor 33 to the appropriate secondary feedback signal. After a fixed delay, the closed sampling switch 30 or 31 opens. If the source function range is changing, adjustment switch 35 will not be closed, and the voltage stored by the capacitor 33 at node 34 will be exactly that of either the AFB1 or AFB2 signal. However, if the measure function range is changing, adjustment switch 35 and one of the connect switches 36 or 37 will be closed to slightly increase the magnitude of the stored voltage on node 34. This process applies a fixed voltage to the voltage divider formed by resistors 38 and 39. The choice between switches 36 and 37 is made so as to route the voltage that matches the polarity of the voltage stored on the capacitor 33.

The sampled and stored voltage at node 34 is passed through the absolute value amplifier 40 and inverting amplifier 41. The outputs are a positive and negative version of the voltage of node 34, termed ADAC and NADAC, respectively. In order to maintain accuracy within the conversion, very high precision components are used for the amplifiers. To a large extent, the accuracy of those two amplifiers determines the transparency of the range change process to the instrument output.

Referring again to FIG. 2A, the ADAC and AFB signals are connected to the positive voltage V+ and positive current I+ inputs of the switch control 22 through secondary input switches 43 and 51. The NADAC and AFB signals are connected to the negative voltage V− and negative current I− inputs of the switch control 22 through secondary input switches 43 and 51.

In the case where the instrument is programmed to be a voltage source of positive polarity, the V+ line is routed through control switching block 22 to output stage 23. Normally this line is driven through primary input switch 42 by the combination of the VDAC and VFB signals. With the instrument output voltage at its programmed value, the voltages of the two signals will be of equal magnitude, but opposite polarity. This results in a summed value of zero, and no resultant movement by the output.

Once the sample-and-hold circuit has completed its capture of the secondary feedback signal, AFB, and generation of the positive secondary setpoint signal, ADAC, these signals are summed and fed to the secondary input switch 43. Since AFB and ADAC are of equal magnitude, but opposite polarity, their sum is zero as well. Control is then switched from the normal feedback loop to the secondary feedback loop by closing the secondary input switch 43 and then opening the primary input switch 42. This make-before-break action is critical, because there must be at least one feedback loop enabled in order to keep the instrument output in control. Once the primary input switch 42 is opened, the values of VDAC and VFB no longer have any influence on the state of the system. The components creating them, namely the voltage D/A converter 1 and the attenuator 15, are then changed in any order and manner without affecting the output of the unit.

Once the setpoint and range selections have been changed, the range change process is completed by closing switch 42 and opening switch 43, again in a make-before-break action. Finally switch 32 is closed, resetting the sample-and-hold circuitry. The basic operation of a range change is the same for voltage or current, positive or negative polarity, and source range change or measure range change, except that the selection and operation of the input switches 42, 43, 50 and 51 and secondary input switches 30, 31 varies according to make the proper connections.

The complete range change process takes no more than ten milliseconds to perform, so drift of the secondary feedback system is not an issue. This drift is composed of two effects. First, the various resistor voltage dividers used in the secondary feedback system are subject to temperature drift effects. However, over this extremely short time duration, they are stable, regardless of the stability of the ambient temperature environment. Second, the stored voltage on the capacitor 33 in the sample-and-hold circuit will change as the bias current of the absolute value amplifier 40 flows into the capacitor. The use of very low bias current amplifiers in the design of the absolute value amplifier 40 minimizes this issue.

The embodiments of the invention shown and described are exemplary. Variations are considered to be within the scope and spirit of the invention.

What is claimed is:

1. A source measure unit comprising:
   an output stage amplifier having an output and an input;
   a primary feedback loop from the amplifier output to the amplifier input, said primary feedback loop providing selectable ranges;
   a secondary feedback loop from the amplifier output to the amplifier input;
   a sample-and-hold circuit connected in the secondary feedback loop to sample and store a voltage representing an output of the amplifier;
   a first switch connected between the primary feedback loop and the input; and
   a second switch connected between the secondary feedback loop and the input, said first switch being open and said second switch being closed during range selection.

2. A source measure unit according to claim 1 wherein the switches are connected so that at least one of the feedback loops is always connected to the amplifier input during operation.

3. A source measure unit according to claim 1 wherein the switches are operatively connected so that at least one of the switches is always closed during operation.

4. A source measure unit according to claim 1 wherein the sample-and-hold circuit includes a capacitor connected to store a sampled voltage from the amplifier output.

5. A source measure unit according to claim 4 wherein the sample-and-hold circuit includes a reset switch for discharging the capacitor.

6. A source measure unit according to claim 1 wherein the sample-and-hold circuit includes an absolute value amplifier connected to output an absolute value of the stored voltage.

7. A source measure unit according to claim 1 wherein the sample-and-hold circuit includes an inverting amplifier connected to invert the stored voltage.

8. A source measure unit according to claim 1 further comprising a voltage applied to adjust the stored voltage.

9. A source measure unit according to claim 1 wherein the stored voltage represents an output current of the output stage amplifier.

10. A source measure unit according to claim 9 wherein the output current is sensed by a secondary current differential amplifier connected across a resistance connected to the amplifier output, an output of the secondary current amplifier being connected to the sample-and-hold circuit.

11. A source measure unit according to claim 10 further comprising a pair of diodes connected in antiparallel relationship across the resistor.

12. A source measure unit according to claim 1 wherein the stored voltage represents an output voltage of the output stage amplifier.

13. A source measure unit according to claim 12 wherein the output voltage is sensed by a secondary voltage differential amplifier connected across a resistance connected to the amplifier output, an output of the secondary voltage amplifier being connected to the sample-and-hold circuit.

14. A source measure unit according to claim 1 wherein the primary feedback signal represents an output current.

15. A source measure unit according to claim 14 wherein the output current is sensed by a differential amplifier connected across a resistance, the resistance being variable to select a range of output currents to be sensed.

16. A source measure unit according to claim 1 wherein the primary feedback loop carries a signal that represents an output voltage of the output stage amplifier.

17. A source measure unit according to claim 16 wherein the output voltage is sensed by a differential amplifier connected across a resistance, the resistance being variable to select a range of output voltages to be sensed.

18. A source measure unit according to claim 1 further comprising an analog-to-digital converter connected to the primary feedback loop for providing a sensed signal output.

19. A source measure unit according to claim 1 further comprising a switching control for connecting one of several signals to the amplifier input.

20. A source measure unit according to claim 19 wherein the several signals each comprise a setpoint signal and a signal from the primary feedback loop.

21. A source measure unit comprising:
an output stage amplifier having an output and an input;
a voltage programmer having a voltage setpoint output;
a voltage program inverter connected to invert the voltage programmer output to provide an inverted voltage setpoint;
a current programmer having a current setpoint output;
a current program inverter connected to invert the current programmer output to provide an inverted current setpoint;
a current range control resistance connected to the output stage amplifier output and variable for selecting a range of output currents;
a primary current feedback loop from the output stage amplifier output to the output stage amplifier input including a primary current differential amplifier connected across the current range control resistance, an output of the primary current differential amplifier being connected to the current setpoint to provide a positive current control signal and connected to the inverted current setpoint to provide a negative current control signal;
a voltage range control resistance connected to the output stage amplifier output and variable for selecting a range of output voltages;
a primary voltage feedback loop from the output stage amplifier output to the output stage amplifier input including a primary voltage differential amplifier connected across the voltage range control resistance, an output of the primary voltage differential amplifier being connected to the voltage setpoint to provide a positive voltage control signal and connected to the inverted voltage setpoint to provide a negative voltage control signal;
a switching control connected to the output stage amplifier input and having a positive current input, a negative current input, a positive voltage input, and a negative voltage input, the switching control selectively connecting one of the switching control inputs to the output stage amplifier input;
primary input switches for connecting the respective control signals to the respective switching control inputs such that the current control signal is connected to the positive current input, the inverted current control signal is connected to the negative current input, the voltage control signal is connected to the positive voltage input, and the inverted voltage control signal is connected to the negative voltage input;
a secondary current feedback loop from the output stage amplifier output including a secondary current differential amplifier connected across a secondary current resistance at the amplifier output;
a secondary voltage feedback loop from the output stage amplifier output including a secondary voltage differential amplifier connected across a secondary voltage resistance at the amplifier output;
a sample-and-hold circuit having an input connected to the outputs of the secondary differential amplifiers and having a secondary output and an inverted secondary output;
a current sampling input switch for connecting the secondary current amplifier to the sample-and-hold circuit input;
a voltage sampling input switch for connecting the secondary voltage amplifier to the sample-and-hold circuit input; and
secondary input switches for connecting the secondary feedback loop to the respective switching control inputs such that the secondary output and sample-and-hold input are connected to the positive current input and the positive voltage input, and the inverted secondary current output and the sample-and-hold input are connected to the negative current input and the negative voltage input.

22. A source measure unit according to claim 21 wherein the sampling input switches are connected so that at least one of the feedback loops is always connected to the switching control input during operation.

23. A source measure unit according to claim 21 wherein the sample-and-hold circuit includes a capacitor connected to store a sampled voltage from one of the secondary feedback differential amplifiers through the respective sampling input switch.

24. A source measure unit according to claim 23 wherein the sample-and-hold circuit includes a reset switch for discharging the capacitor.

25. A source measure unit according to claim 23 wherein the sample-and-hold circuit includes an absolute value amplifier connected to the capacitor to take the absolute value of the stored voltage, the output of the absolute value amplifier providing the secondary output.

26. A source measure unit according to claim 25 wherein the sample-and-hold circuit includes an inverting amplifier connected to the output of the absolute value amplifier to provide the inverted secondary output.

27. A source measure unit according to claim 21 further comprising a voltage applied to adjust a voltage stored in the sample-and-hold circuit.

28. A method of operating a source measure unit comprising the steps of:

providing a setpoint signal to an amplifier input;

providing selectable range feedback signals representing an output of the amplifier connected to the amplifier input;

sampling and storing the output of the amplifier;

connecting the stored output to the input;

disconnecting the output from the input;

adjusting the input to the amplifier;

reconnecting the output to the input; and disconnecting the stored output from the input, wherein the step of adjusting the input includes selecting a range feedback signal after the output is disconnected from the input and before reconnecting the output to the input.

29. A method according to claim 28, wherein the step of adjusting the input includes adjusting the setpoint signal after the output is disconnected from the input and before reconnecting the output to the input.

* * * * *